United States Patent [19]

Kim

[11] Patent Number: 5,641,592

[45] Date of Patent: Jun. 24, 1997

[54] METHOD FOR FABRICATING PHASE SHIFT MASK

[75] Inventor: Hong Seok Kim, Chungcheongbuk-do, Rep. of Korea

[73] Assignee: LG Semicon Co., Ltd., Chungcheongbuk-do, Rep. of Korea

[21] Appl. No.: 563,261

[22] Filed: Nov. 28, 1995

[30] Foreign Application Priority Data

Sep. 25, 1995 [KR] Rep. of Korea ............... 31654/1995

[51] Int. Cl.[6] ..................................................... G03F 9/00
[52] U.S. Cl. .......................... 430/5; 430/322; 430/326; 430/394
[58] Field of Search ................... 430/5, 322, 326, 430/394

[56] References Cited

U.S. PATENT DOCUMENTS 5,429,897  7/1995  Yoshioka et al. ................ 430/5

*Primary Examiner*—S. Rosasco

[57] ABSTRACT

A method for fabricating a half-tone mask having a main chip region and a guard-board region, in which a deposition on entire surface by electrolytic process is made possible to simplify the fabricating process, including the steps of providing a transparent substrate, forming a half-tone mask on the transparent substrate, and selectively forming light shielding layers in the guard-board region of the half-tone mask.

33 Claims, 4 Drawing Sheets

FIG. 1 prior art
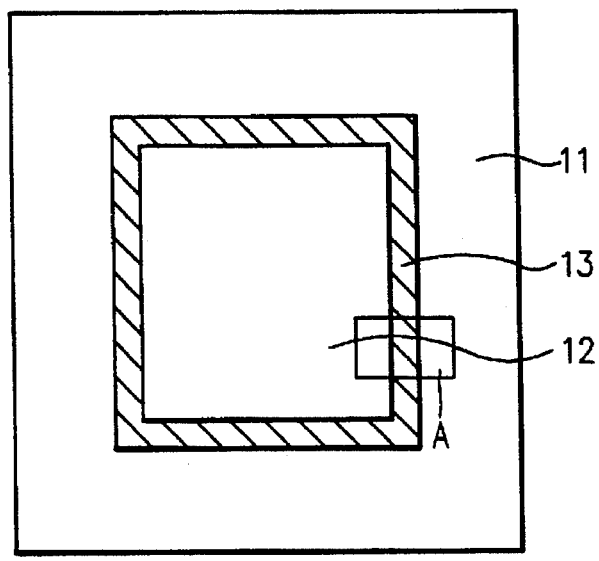
FIG. 2a prior art
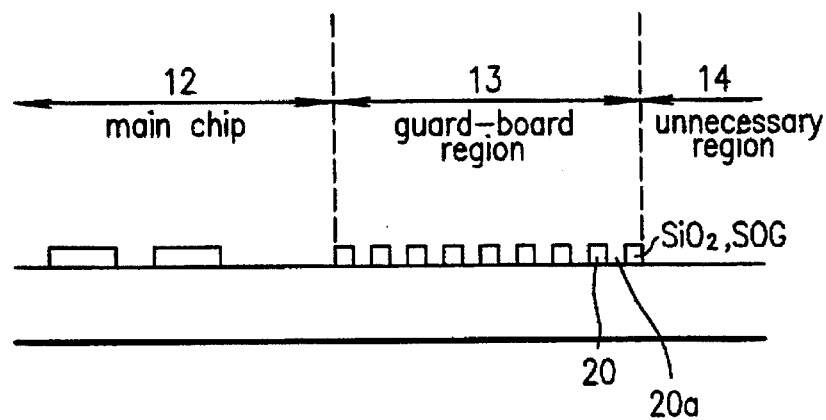
FIG. 2c prior art
FIG. 2b prior art
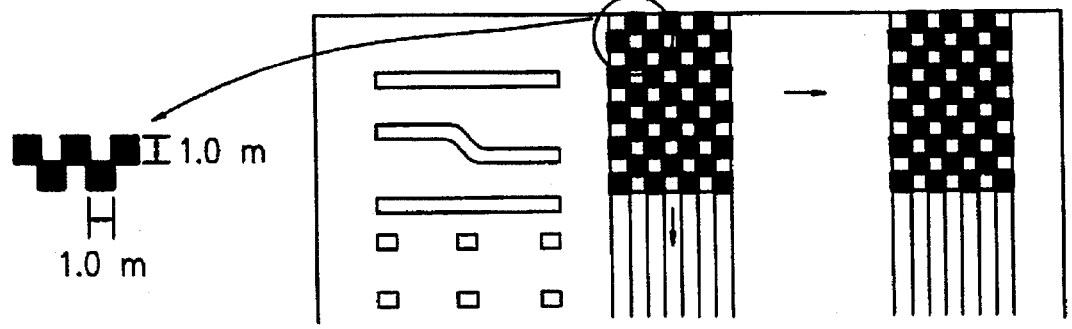

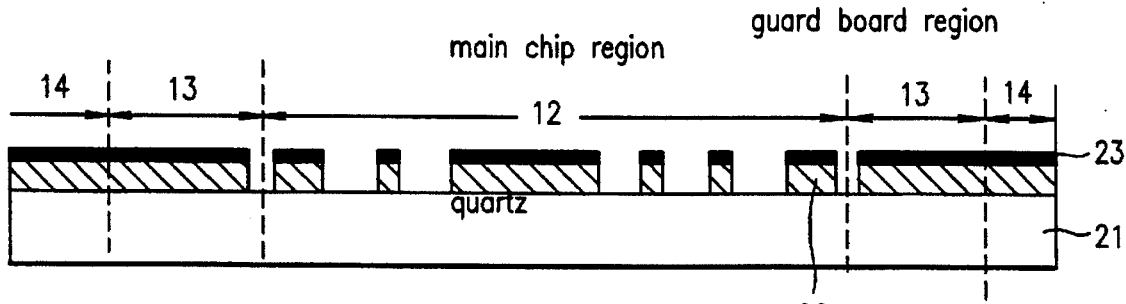
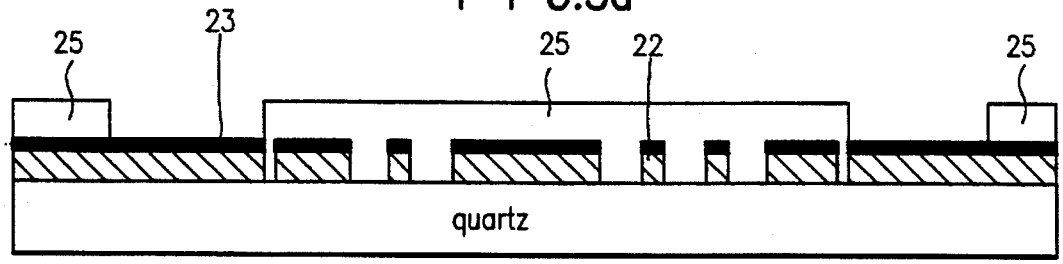
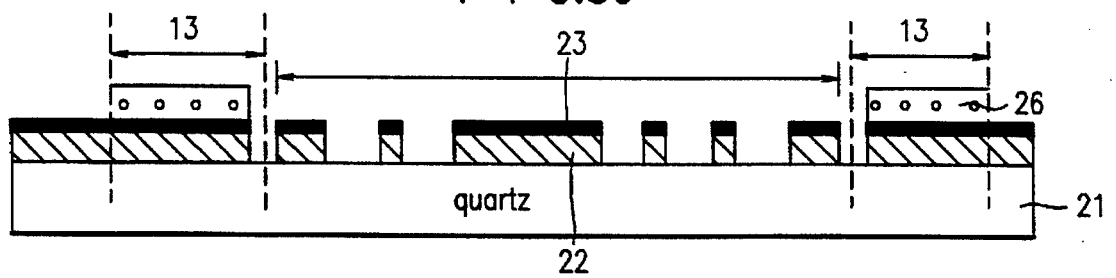
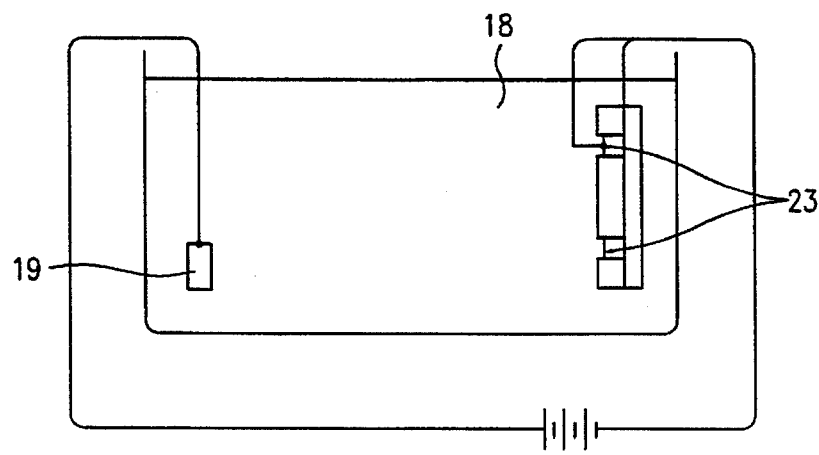

5,641,592

METHOD FOR FABRICATING PHASE SHIFT MASK

BACKGROUND OF THE INVENTION

This invention relates to a half-tone mask, and more particularly to a method for fabricating a half-tone mask using, an electrolytic process which makes it possible to simplify the fabricating process.

In general, in order to fabricate chips, a plurality of chip regions are defined on a wafer using a stepping process. Then the chip regions are subjected to processes for many times.

However, in the stepping process in which a half-tone mask of a semitransparent material with a transmissivity of 4–10% is used, regions that have been multiply exposed can happen through the many times of exposure processes.

That is, even though the half-tone mask has a transmissivity of 4–10%, a light transmission through the mask having the transmissivity of, 8–20% for doubly exposed regions and 16–40% for four times exposed regions may expose the photoresist, resulting in the form of undesired patterns on the wafer.

Accordingly, to solve the aforementioned problem, a region that is not transmissive to lights is required on the half-tone mask, for which a guard-board is provided on at the periphery of a main chip with which multiple exposure can be prevented.

The guard-board of the conventional half-tone mask will be explained with reference to the attached drawing.

FIG. 1 illustrates a guard-board in the conventional half-tone mask, FIG. 2a is an enlarged sectional view of part "A" the guard-board of FIG. 7, FIG. 2b is an enlarged plan view of the guard-board of FIG. 1, and FIG. 2c is a detail view of part "B" of FIG. 2b.

As shown in FIG. 1, a conventional half-tone mask has the main chip 12 at the center, around which a guard-board region 13 is formed.

The region excluding the main chip 12 and the guard-board region 13 is an unnecessary region 11 in the mask.

The guard-board occupies an area of about $2\times10^8$ $\mu m^2$ in the half-tone mask. As shown in FIG. 2a–2c, the guard-board has a shape of a checker board with a plurality of phase shift layers 20 each having a size of 1.0 $\mu m \times 1.0$ $\mu m$. That is, the guard-board is formed by using a method including the steps of forming a phased shift layer 20 of silicon oxide film($SiO_2$) or SOG(Spin On Glass) on a quartz substrate and forming a plurality of contact holes 20a each having a size of 1.0 $\mu m \times 1.0$ $\mu m$ with a pitch of 1:1 in the phase shift layer 20.

However, the guard-board of the conventional half-tone mask has the following problems.

In general masks, contact holes of about 2.0 $\mu m \times 2.0$ $\mu m$ size are used in fabrication of semiconductor devices.

However, the formation of the guard-board of the conventional half-tone mask requires formation of a plurality of contact holes each having a size of 1.0 $\mu m \times 1.0$ $\mu m$ with a pitch of 1:1. The contact holes have to be formed an area of about $2\times10^8$ $\mu m^2$ maintaining a size error within $\pm10\%$, which is a difficult process to carry out. As a result, productivity in mass production drops, causing mask costs to increase.

SUMMARY OF THE INVENTION

The object of this invention, designed to solve the aforementioned problems, is to provide a method for fabricating a half-tone mask, in which the fabricating process is simplified for improving mass productivity and reducing mask production cost.

To achieve the objects of this invention, there is provided a method for fabricating a phase shift mask which has a main chip region and a guard-board region, the method including the steps of providing a transparent substrate, forming a half-tone mask on the transparent substrate, and selectively forming light shielding layers in the guard-board region of the half-tone mask.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 illustrates a guard-board in a conventional half-tone mask;

FIG. 2a is an enlarged sectional view of the guard-board of FIG. 1.

FIG. 2b is an enlarged plan view of the guard-board of FIG. 1.

FIG. 2c is a detail view of a part of FIG. 2b.

FIGS. 3a–3e illustrate sectional views of a half-tone mask showing a method for fabricating the half-tone mask in accordance with a preferred embodiment of this invention;

FIG. 4 shows an electrolytic system in accordance with this invention; and

DETAILED DESCRIPTION OF THE PREFERRED EMBODIMENT

Referring the drawings, the method of fabricating a half-tone mask of this invention will be described in detail hereinafter.

FIGS. 3a–3e illustrate sectional views of a half-tone mask showing a method for fabricating the half-tone mask in accordance with a preferred embodiment of this invention, and FIG. 4 shows an electrolytic system in accordance with this invention.

Figure 3A:
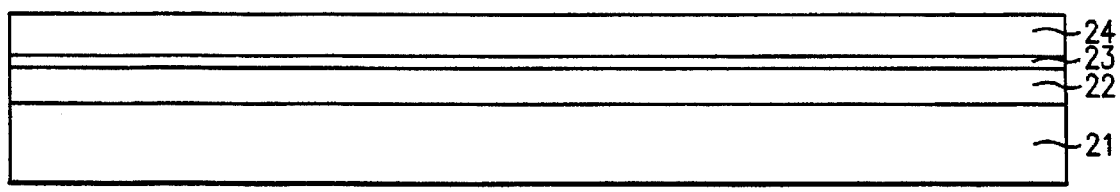

First, as shown in FIG. 3a, a phase shift layer 22 and a thin metal film 23 are formed successively on a transparent substrate 21, such as quartz.

In this time, the phase shift layer 22 is formed of chromium nitride(CrON) or molybdenum silicon nitride (MoSiON) and the metal film 23 is formed of chrome. This metal film 23 used, not as a light shielding layer, but as a semitransparent layer, is very thin.

Then, a photoresist film 24 is deposited on the metal film 23.

Figure 3B:
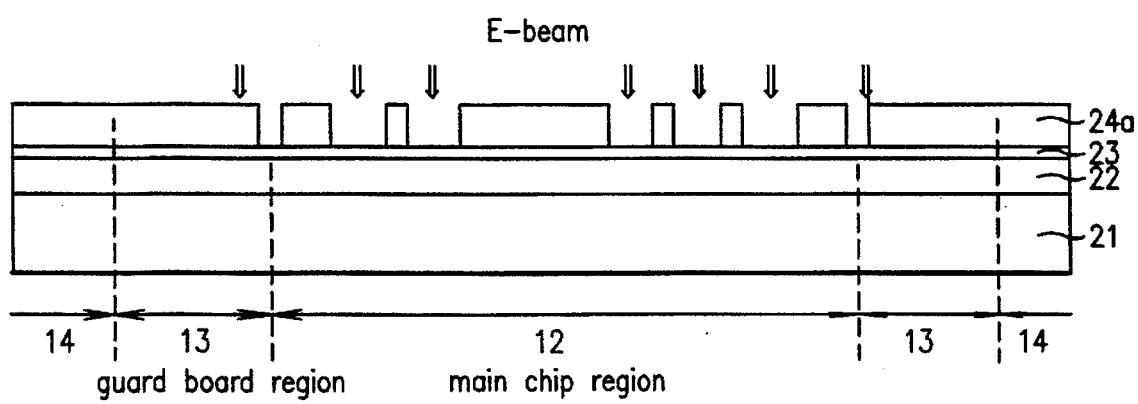

As shown in FIG. 3b, the photoresist film 24 is subjected to photolithography or selective projection of an electron beam to form a photoresist pattern 24a.

As shown in FIG. 3c, a chip mask pattern is formed in a main chip region 12 by selectively removing portions of metal film 23 and the phase shift layer 22 by etching process. Then, the photoresist film pattern 24a is removed.

In this time, the main chip region 12 and the guard-board region 13 may or may not be separated (FIG. 3b shows they are separated).

As shown in FIG. 3d, a photoresist film is deposited again on the entire surface, which is subjected to exposure and development so as to form a photoresist pattern 25 exposing the metal film 23 only in the guard-board region 13.

Then as shown in FIG. 3e, a metal is plated in the guard-board region 13 to form a light shielding layer 26 using a selective electrolytic process. Then the photoresist pattern 25 is removed.

In this time, the electrolytic process is performed using a system as shown in FIG. 4.

That is, the electrolytic process is carried out with an electrolytic solution filled electrolysis tank 18 having the substrate shown in FIG. 3d submerged therein, together with the metal film 23 connected to a cathode, and a metal 19 to be consumed (i.e., a consumer metal, material of the light shielding layer), e.g., chrome(Cr) or molybdenum(Mo). submerged and connected to an anode.

Then, the consumer metal 19 is selectively plated on an exposed part of the metal film 23, i.e., on the guard-board region 13.

Here, as the electrolytic solution, a sulfuric acid water solution containing chromium oxide is used in case the consumer metal 19 is chrome, and a sulfuric acid water solution containing molybdenum oxide($MoO_2$) is used in case the consumer metal 19 is molybdenum(Mo).

In the meantime, the light shielding layer 26 can be selectively formed in the guard-board region 13 in accordance with another embodiment.

Figure 5A:
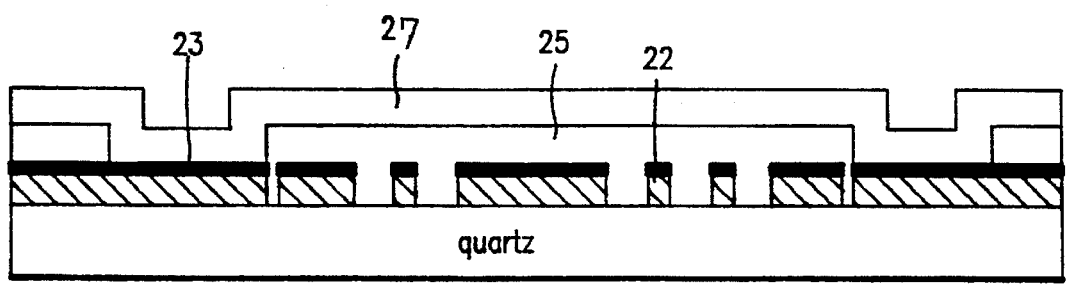
FIGS. 5a–5b illustrate sectional views of a half-tone mask showing a method for fabricating the half-tone mask in accordance with another embodiment of this invention.
Figure 5B:
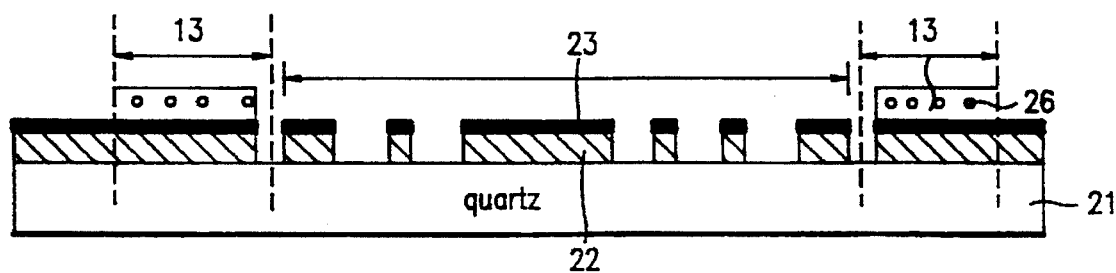

FIGS. 5a–5b illustrate sectional views of a half-tone mask showing a method for fabricating the half-tone mask in accordance with another embodiment of this invention.

As, as shown in FIG. 5a, a light shielding layer 26 can be formed in the guard-board region 13 using a method including the steps of, depositing a light shielding material 27, such as chrome or molybdenum, on the entire surface under the condition that the substrate having the pattern 25 thereon has been formed using the method explained in FIGS. 3a–3d, and the step of, selectively removing the light shielding material 27 formed on the photoresist pattern 25 and the photoresist pattern 25 using with a lift-off process, as shown in FIG. 5b.

The method for fabricating the half-tone mask in accordance with this invention as explained hereinabove has the following advantages.

For example, since the light shielding layer can be formed in the guard-board region using an electrolytic process or a lift-off process, the fabricating process is simplified the productivity is improved, and the low cost production of the half-tone mask can be accomplished.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a phase shift mask which has a main chip region and a guard-board region, comprising the steps of:

providing a transparent substrate;

forming a phase shift layer on the transparent substrate;

forming a metal film on the phase shift layer; and forming a light shielding layer on the metal film so as to form a guard-board region of a phase shift mask, wherein the guard-board region has no contact holes.

2. The method as claimed in claim 1, wherein the transparent substrate is formed of quartz.

3. The method as claimed in claim 1, further comprising the step of:

removing portions of the phase shift layer and the metal film to form the main chip region.

4. The method as claimed in claim 3, wherein the phase shift layer is formed of either chromium nitride(CrON) or molybdenum silicon nitride(MoSiON).

5. The method as claimed in claim 1, wherein the light shielding layer is formed using an electrolytic process.

6. The method as claimed in claim 5, wherein the electrolytic process is carried out using an electrolysis tank with an electrolytic solution therein, the tank having a light shielding metal connected to an anode and the metal film connected to a cathode.

7. The method as claimed in claim 6, wherein the electrolytic solution is a sulfuric acid water solution containing chromium oxide if the light shielding metal is chrome, and a sulfuric acid water solution containing molybdenum oxide if the light shielding metal is molybdenum.

8. The method as claimed in claim 6, wherein the light shielding metal is formed of chrome or molybdenum.

9. The method as claimed in claim 1, wherein said step of forming the light shielding layer includes the steps of:

forming a mask layer on the metal film in the main chip region, and depositing a light shielding material on the mask layer and on the metal film in the guard-board region.

10. The method as claimed in claim 9, wherein said step of forming the light shielding layer further includes the steps of:

removing the light shielding material deposited on the mask layer, and removing completely the mask layer.

11. A method for fabricating a phase shift mask, comprising the steps of:

forming a transparent substrate;

forming a phase shift layer on the transparent substrate;

forming a metal film on the phase shift layer;

forming a half-tone mask by selectively removing the phase shift film and the metal film;

forming a mask layer on the metal film to expose a guard-board region of the half-tone mask; and forming a light shielding layer on the metal film in the guard-board region of the half-tone mask so as to form a guard-board region of a phase shift mask, wherein the guard-board region of the phase shift mask has no contact holes.

12. The method as claimed in claim 11, wherein said step of forming the mask layer includes the step of:

forming a photoresist pattern on the metal film in a main chip region of the half-tone mask.

13. The method as claimed in claim 11, wherein the metal film is formed of chrome.

14. The method as claimed in claim 11, wherein the phase shift layer is formed of either chromium nitride (CrON) or molybdenum silicon nitride (MoSiON).

15. The method as claimed in claim 11, wherein the light shielding layer is formed using an electrolytic process.

16. The method as claimed in claim 15, wherein the electrolytic process is carried out using an electrolysis tank with an electrolytic solution therein, the tank having a light shielding metal connected to an anode and the metal film connected to a cathode.

17. The method as claimed in claim 16, wherein the electrolytic solution is a sulfuric acid water solution containing chromium oxide if the light shielding metal is chrome, and a sulfuric acid water solution containing molybdenum oxide if the light shielding metal is molybdenum.

18. The method as claimed in claim 16, wherein the light shielding metal is formed of chrome or molybdenum.

19. The method as claimed in claim 11, wherein said step of forming the light shielding layer includes the step of:

depositing a light shielding material on the mask layer and over the exposed guard-board region of the half-tone mask, removing the light shielding material deposited on the mask layer, and removing completely the mask layer.

20. A phase shift mask comprising:

a transparent substrate;

a phase shift pattern formed on said transparent substrate;

a metal film pattern formed on said phase shift pattern; and a light shielding layer formed on said metal film pattern to form a guard-board region of a phase shift mask, wherein the guard-board region of the phase shift mask has no contact holes.

21. The phase shift mask of claim 20, wherein said phase shift pattern and said metal film pattern have a substantially same pattern configuration.

22. The phase shift mask of claim 20, wherein said phase shift pattern is made of either chromium nitride (CrON) or molybdenum silicon nitride (MoSiON).

23. The phase shift mask of claim 20, wherein said light shielding layer is formed using an electrolytic process.

24. The phase shift mask of claim 23, wherein the electrolytic process is carried out using an electrolysis tank with an electrolytic solution therein, the tank having a light shielding metal connected to an anode and the metal film connected to a cathode.

25. The phase shift mask of claim 24, wherein the electrolytic solution is a sulfuric acid water solution containing chromium oxide if the light shielding metal is chrome, and a sulfuric acid water solution containing molybdenum oxide if the light shielding metal is molybdenum.

26. The phase shift mask of claim 24, wherein said light shielding metal is formed of chrome or molybdenum.

27. A method for fabricating a phase shift mask which has a main chip region and a guard board region, comprising the steps of:

providing a transparent substrate;

forming a half-tone mask on the transparent substrate, wherein the half-tone mask is formed in the main chip region and the guard board region; and forming a light shielding layer on the half-tone mask in the guard board region, wherein the guard board region has no contact holes.

28. The method as claimed in claim 27, wherein the half-tone mask is a stack of a phase shift layer and a metal layer.

29. The method as claimed in claim 28, wherein the phase shift layer is formed of either chromium nitride (CrON) or molybdenum silicon nitride (MoSiON).

30. The method as claimed in claim 27, wherein the light shielding layer is formed in the guard board region using an electrolytic process.

31. The method as claimed in claim 30, wherein the electrolytic process is carried out using an electrolysis tank with an electrolytic solution therein, the tank having a light shielding metal connected to an anode and the metal film connected to a cathode.

32. The method as claimed in claim 31, wherein the electrolytic solution is a sulfuric acid water solution containing chromium oxide if the light shielding metal is chrome, and a sulfuric acid water solution containing molybdenum oxide if the light shielding metal is molybdenum.

33. The method as claimed in claim 31, wherein the light shielding metal is formed of chrome or molybdenum.

* * * * *